(12) United States Patent
Mathijssen et al.

(10) Patent No.: US 9,778,025 B2
(45) Date of Patent: Oct. 3, 2017

(54) METHOD AND APPARATUS FOR MEASURING ASYMMETRY OF A MICROSTRUCTURE, POSITION MEASURING METHOD, POSITION MEASURING APPARATUS, LITHOGRAPHIC APPARATUS AND DEVICE MANUFACTURING METHOD

(71) Applicant: ASML NETHERLANDS B.V., Veldhoven (NL)

(72) Inventors: Simon Gijsbert Josephus Mathijssen, Den Bosch (NL); Erik Willem Bogaart, Eindhoven (NL); Patricius Aloysius Jacobus Tinnemans, Hapert (NL); Arie Jeffrey Den Boef, Waalre (NL)

(73) Assignee: ASML NETHERLANDS B.V., Veldhoven (NL)

( * ) Notice: Subject to any disclaimer, the term of this patent is extended or adjusted under 35 U.S.C. 154(b) by 317 days.

(21) Appl. No.: 14/421,434

(22) PCT Filed: Jul. 17, 2013

(86) PCT No.: PCT/EP2013/065069
§ 371 (c)(1),
(2) Date: Feb. 12, 2015

(87) PCT Pub. No.: WO2014/026819
PCT Pub. Date: Feb. 20, 2014

(65) Prior Publication Data
US 2015/0176979 A1    Jun. 25, 2015

Related U.S. Application Data

(60) Provisional application No. 61/684,006, filed on Aug. 16, 2012.

(51) Int. Cl.
*G01B 11/00* (2006.01)
*G03B 27/32* (2006.01)
(Continued)

(52) U.S. Cl.
CPC ............... *G01B 11/14* (2013.01); *G01B 9/02* (2013.01); *G01B 11/27* (2013.01);
(Continued)

(58) Field of Classification Search
CPC .......... G01B 9/02; G01B 11/14; G01B 11/27; G03F 7/70058; G03F 7/70625; G03F 7/70633; G03F 9/7069; G03F 9/7088
(Continued)

(56) References Cited

U.S. PATENT DOCUMENTS

| 6,961,116 B2 | 11/2005 | Den Boef et al. |
| 7,297,971 B2 | 11/2007 | Van Bilsen et al. |

(Continued)

FOREIGN PATENT DOCUMENTS

| JP | 2004-119663 | 4/2004 |
| JP | 2005-268237 | 9/2005 |

(Continued)

OTHER PUBLICATIONS

Japanese Office Action mailed Nov. 24, 2015 for corresponding Japanese Patent Application No. PCT/2015-526914 (8 pages).
(Continued)

*Primary Examiner* — Colin Kreutzer
(74) *Attorney, Agent, or Firm* — Pillsbury Winthrop Shaw Pittman LLP

(57) ABSTRACT

A lithographic apparatus includes an alignment sensor including a self-referencing interferometer for reading the position of an alignment target comprising a periodic structure. An illumination optical system for focusing radiation into a spot on said structure. An asymmetry detection optical (Continued)

system receives a share of positive and negative orders of radiation diffracted by the periodic structure, and forms first and second images of said spot on first and second detectors respectively, wherein said negative order radiation is used to form the first image and said positive order radiation is used to form the second image. A processor for processing together signals from said first and second detectors representing intensities of said positive and negative orders to produce a measurement of asymmetry in the periodic structure. The asymmetry measurement can be used to improve accuracy of the position read by the alignment sensor.

25 Claims, 7 Drawing Sheets

(51) Int. Cl.
G03B 27/54 (2006.01)
G03B 27/74 (2006.01)
G01B 11/14 (2006.01)
G03F 7/20 (2006.01)
G03F 9/00 (2006.01)
G01B 9/02 (2006.01)
G01B 11/27 (2006.01)

(52) U.S. Cl.
CPC ...... *G03F 7/70058* (2013.01); *G03F 7/70625* (2013.01); *G03F 7/70633* (2013.01); *G03F 9/7069* (2013.01); *G03F 9/7088* (2013.01)

(58) Field of Classification Search
USPC ......... 355/67, 68, 71, 77; 356/399–401, 616
See application file for complete search history.

(56) References Cited

U.S. PATENT DOCUMENTS

| | | |
|---|---|---|
| 7,319,506 B2 | 1/2008 | Den Boef et al. |
| 7,528,954 B2 | 5/2009 | Fukui |
| 8,208,121 B2 | 6/2012 | Bijnen et al. |
| 8,593,646 B2 | 11/2013 | Den Boef et al. |
| 8,786,825 B2 | 7/2014 | Van De Kerkhof et al. |
| 2006/0007446 A1 | 1/2006 | Den Boef et al. |
| 2006/0081792 A1 | 4/2006 | Van Bilsen et al. |
| 2007/0064233 A1 | 3/2007 | Fukui |
| 2009/0195768 A1 | 8/2009 | Bijnen et al. |
| 2011/0027704 A1 | 2/2011 | Cramer et al. |
| 2011/0102753 A1 | 5/2011 | Van De Kerkhof et al. |
| 2012/0033193 A1* | 2/2012 | Van Der Schaar . G03F 7/70633 355/67 |
| 2012/0206703 A1* | 8/2012 | Bhattacharyya .... G03F 7/70633 355/67 |
| 2012/0212718 A1 | 8/2012 | Den Boef |
| 2012/0212749 A1 | 8/2012 | Den Boef et al. |
| 2014/0028993 A1* | 1/2014 | Brill ................... G01N 21/4788 355/77 |

FOREIGN PATENT DOCUMENTS

| | | |
|---|---|---|
| JP | 2008-532320 | 8/2008 |
| JP | 2008-244448 | 10/2008 |
| WO | 2011/012624 | 2/2011 |

OTHER PUBLICATIONS

International Preliminary Report and Written Opinion mailed Feb. 26, 2015 for corresponding International Patent Application No. PCT/EP2013/065069 (6 pages).

International Search Report and Written Opinion mailed Feb. 13, 2014 for corresponding International Patent Application No. PCT/EP2013/065069 (8 pages).

* cited by examiner

--PRIOR ART--

$T_{ACQ} = L / v_W$

METHOD AND APPARATUS FOR MEASURING ASYMMETRY OF A MICROSTRUCTURE, POSITION MEASURING METHOD, POSITION MEASURING APPARATUS, LITHOGRAPHIC APPARATUS AND DEVICE MANUFACTURING METHOD

CROSS-REFERENCE TO RELATED APPLICATIONS

This application is the U.S. national phase entry of International Patent Application No. PCT/EP2013/065069, filed Jul. 17, 2013, which claims the benefit of U.S. provisional application 61/684,006, which was filed on Aug. 16, 2012, and which is incorporated herein in its entirety by reference.

FIELD

The present invention relates to measurement of asymmetry in microstructures. The invention may be applied in an improved apparatus and method for measuring the positions of marks on a substrate. The invention in other aspects provides a lithographic apparatus and device manufacturing method, and also an optical element.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to control the lithographic process to place device features accurately on the substrate, alignment marks are generally provided on the substrate, and the lithographic apparatus includes one or more alignment sensors by which positions of marks on a substrate must be measured accurately. These alignment sensors are effectively position measuring apparatuses. Different types of marks and different types of alignment sensors are known from different times and different manufacturers. A type of sensor widely used in current lithographic apparatus is based on a self-referencing interferometer as described in U.S. Pat. No. 6,961,116 (den Boef et al). Generally marks are measured separately to obtain X- and Y-positions. A combined X- and Y-measurement can be performed using the techniques described in published patent application US 2009/195768 A (Bijnen et al), however. The contents of both of these applications are incorporated herein by reference.

There is continually a need to provide more accurate position measurements, especially to control overlay error as product features get smaller and smaller. One cause of error in alignment is asymmetry in the features making up a mark, which may be caused for example by processing to apply subsequent product layers. Metrology tools such as scatterometers exist that can measure asymmetry and other parameters of microstructures. These could be applied in principle to measure and correct for asymmetry or other parameters. In practice, however, they do not operate with the high throughput required in the alignment task for high-volume lithographic production. They may also be incompatible with the alignment environment in terms of their bulk, their mass or power dissipation.

SUMMARY

In a broader aspect, the invention aims to provide an alternative method and apparatus for the measurement of asymmetry (or more generally, asymmetry dependent parameters) in microstructures.

The invention in another aspect aims to provide an improved position measurement apparatus, for example an alignment sensor in a lithographic apparatus, that is able to correct for the influence of mark asymmetry on position measurements. In that regard, the inventors have sought a method of measuring asymmetry that can be applied to measuring asymmetry in an alignment mark simultaneously with position measurement from that mark, without unduly reducing throughput of an alignment system.

The invention in a first aspect provides an apparatus for method of measuring an asymmetry dependent parameter of a periodic structure on a substrate, the apparatus comprising of:

an illumination optical system for focusing radiation into a spot on said structure;

first and second detectors of radiation;

a detection optical system for receiving radiation diffracted by the periodic structure, including at the same time both positive and negative higher orders of diffracted radiation, and forming first and second images of said spot on first and second detectors respectively, wherein said negative order radiation is used to form the first image and said positive order radiation is used to form the second image; and a processor for processing together signals from said first and second detectors representing intensities of said positive and negative orders to produce a measurement of asymmetry in the periodic structure.

Because the positive and negative orders are optically separated they can be detected simultaneously, asymmetry measurements can proceed at a speed parallel to the position measurement. The phrase "positive and negative diffraction orders" in this specification refers to any of the $1^{st}$ and higher diffraction orders. Diffraction orders include zeroth order (specular reflection) which is neither positive nor negative, and then higher orders which exist in complementary pairs, conveniently referred to as positive and negative. Non-zero orders a can be referred to as higher orders. Thus, $+1^{st}$ order and $-1^{st}$ order are examples of positive and negative orders, as are $+2^{nd}$ and $-2^{nd}$, $+3^{rd}$ and $3^{rd}$ and so forth. The examples will be illustrated primarily with reference to $+1^{st}$ and $-1^{st}$ orders, without limitation. In the embodiments described, zeroth order diffracted radiation is also processed. In some embodiments, said illumination optical system is selectively operable in an on-axis illumination mode in which said spot is formed by a beam radiation aligned with an optical axis of said detection optical system and an off-axis mode of illumination in which said spot is formed by at least two beams of radiation incident from directions symmetrically opposite one another with respect to an optical axis of said detection optical system.

In some embodiments, said first and second detectors can resolve different wavelengths of radiation and said processor compares signals captured at more than one wavelength for each of said positive and negative orders to provide said measure of asymmetry. Measuring asymmetry at different wavelengths simultaneously opens the possibility for, asymmetry measurement to proceed at a speed parallel to the alignment (position) measurement.

Different splitting arrangements can be envisaged for causing said images of the spot to be formed with different positive and negative orders of diffraction. Some embodiments of the invention use a splitting element located in a pupil plane for diverting opposite portions of a radiation field in different directions, whereby diffraction orders passing through one half of the pupil plane are deflected differently to diffraction orders passing through the other half. The splitting element may have portions formed to allow one or more zero order beams to pass undiverted.

In some embodiments the apparatus further includes a position sensing optical system, the position sensing optical system and the detection optical system for asymmetry each receiving a share of said positive and negative orders of diffracted radiation. In particular embodiments based on the known position sensing apparatus, the position sensing optical system comprising an interferometer for generating a position-sensitive signal that varies as the spot of radiation traverses the periodic structure, the processor further processing the position-sensitive signal to calculate a position of the substrate relative to the apparatus. The processor can be arranged to use said measurement of asymmetry (or asymmetry dependent parameter) when calculating said position, to correct at least partially for asymmetry sensitivity in the position-sensitive signal.

The invention further provides a lithographic apparatus comprising:
a patterning subsystem for transferring a pattern to a substrate;
a measuring subsystem for measuring positions of said substrate in relation to the patterning subsystem,
wherein the patterning subsystem is arranged to use the positions measured by the measuring subsystem to apply said pattern at a desired position on the substrate and wherein the measuring subsystem includes an apparatus according to the invention as set forth above.

The invention yet further provides a method of measuring an asymmetry dependent parameter of a periodic structure formed on a substrate, the method comprising the steps of:
(a) focusing radiation into a spot on said structure;
(b) receiving radiation diffracted by the periodic structure, including at the same time both positive and negative higher orders of diffracted radiation,
(c) forming first and second images of said spot on first and second detectors respectively, wherein said negative order radiation is used to form the first image and said positive order radiation is used to form the second image; and
(d) processing together signals from said first and second detectors representing intensities of said positive and negative orders to produce a measurement of asymmetry in the periodic structure.

The invention yet further provides a method of manufacturing devices wherein a device pattern is applied to a substrate using a lithographic process, the method including positioning the applied pattern by reference to measured positions of one or more periodic structures formed on the substrate, the measured positions being obtained by a method according to the invention as set forth above.

BRIEF DESCRIPTION OF THE DRAWINGS

Embodiments of the invention will now be described, by way of example only, with reference to the accompanying schematic drawings in which:

FIG. 2(a) and FIG. 2(b), illustrates various forms of an alignment mark that may be provided on a substrate in the apparatus of FIG. 1;

DETAILED DESCRIPTION OF EXEMPLARY EMBODIMENTS

Figure 1:
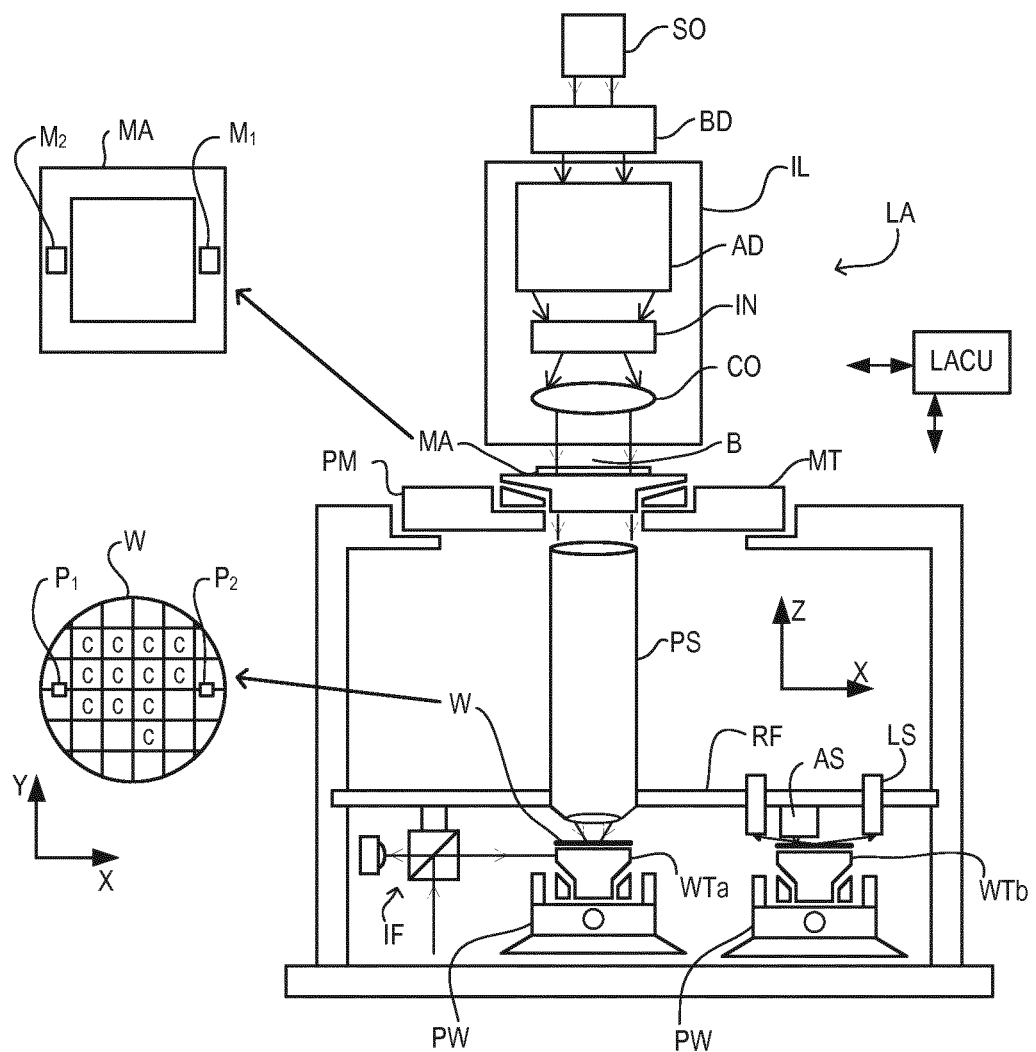
FIG. 1 depicts an exemplary lithographic apparatus including an alignment sensor forming measuring apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or EUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WTa or WTb constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure. The two substrate tables WTa and WTb in the example of FIG. 1 are an illustration of this. The invention disclosed herein can be used in a stand-alone fashion, but in particular it can provide additional functions in the pre-exposure measurement stage of either single- or multi-stage apparatuses.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WTa/WTb can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WTa/WTb may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WTa/WTb are kept essentially stationary, while an entire pattern imparted to the radiation beam is projected onto a target portion C at one time (i.e. a single static exposure). The substrate table WTa/WTb is then shifted in the X and/or Y direction so that a different target portion C can be exposed. In step mode, the maximum size of the exposure field limits the size of the target portion C imaged in a single static exposure.

2. In scan mode, the mask table MT and the substrate table WTa/WTb are scanned synchronously while a pattern imparted to the radiation beam is projected onto a target portion C (i.e. a single dynamic exposure). The velocity and direction of the substrate table WTa/WTb relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WTa/WTb is moved or scanned while a pattern imparted to the radiation beam is projected onto a target portion C. In this mode, generally a pulsed radiation source is employed and the programmable patterning device is updated as required after each movement of the substrate table WTa/WTb or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two substrate tables WTa and WTb and two stations—an exposure station and a measurement station—between which the substrate tables can be exchanged. While one substrate on one substrate table is being exposed at the exposure station, another substrate can be loaded onto the other substrate table at the measurement station so that various preparatory steps may be carried out. The preparatory steps may include mapping the surface of the substrate using a level sensor LS and measuring the position of alignment markers on the substrate using an alignment sensor AS. This enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations.

The apparatus further includes a lithographic apparatus control unit LACU which controls all the movements and measurements of the various actuators and sensors described. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

Figure 2:
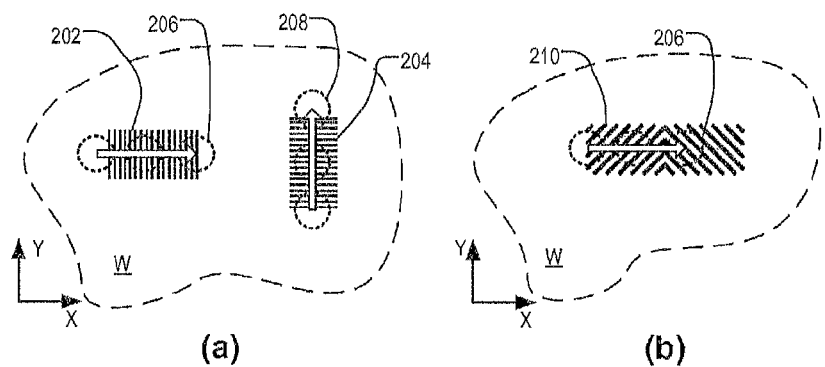
FIG. 2, comprising

FIG. 2(a) shows examples of alignment marks 202, 204, provided on substrate W for the measurement of X-position and Y-position, respectively. Each mark in this example comprises a series of bars formed in a product layer or other layer applied to or etched into the substrate. The bars are regularly spaced and act as grating lines so that the mark can be regarded as a diffraction grating with a well-known spatial period (pitch). The bars on the X-direction mark 202 are parallel to the Y-axis to provide periodicity in the X direction, while the bars of the Y-direction mark 204 are parallel to the X-axis to provide periodicity in the Y direction. The alignment sensor AS (shown in FIG. 1) scans each mark optically with a spot 206, 208 of radiation, to obtain a periodically-varying signal, such as a sine wave. The phase of this signal is analyzed, to measure the position of the mark, and hence of substrate W, relative to the alignment sensor, which in turn is fixed relative to the reference frame RF of the apparatus. The scanning movement is indicated schematically by a broad arrow, with progressive positions of the spot 206 or 208 indicated in dotted outline. The pitch of the bars (grating lines) in the alignment pattern is typically much greater than the pitch of product features to be formed on the substrate, and the alignment sensor AS uses a wavelength of radiation (or usually plural wavelengths) much longer than the exposure radiation to be used for applying patterns to the substrate. Fine position information can be obtained, however, because the large number of bars allows the phase of a repeating signal to be accurately measured.

Coarse and fine marks may be provided, so that the alignment sensor can distinguish between different cycles of the periodic signal, as well as the exact position (phase) within a cycle. Marks of different pitches can also be used for this purpose. These techniques are again well known to the person skilled in the art, and will not be detailed herein. The design and operation of such sensors is well known in the art, and each lithographic apparatus may have its own design of sensor. For the purpose of the present description, it will be assumed that the alignment sensor AS is generally of the form described in U.S. Pat. No. 6,961,116 (den Boef et al). FIG. 2(b) shows a modified mark for use with a similar alignment system, which X- and Y-positions can be obtained through a single optical scan with the illumination spot 206. The mark 210 has bars arranged at 45 degrees to both the X- and Y-axes. This combined X- and Y-measurement can be performed using the techniques described in published patent application US 2009/195768 A (Bijnen et al), the contents of which are incorporated herein by reference.

Figure 3:
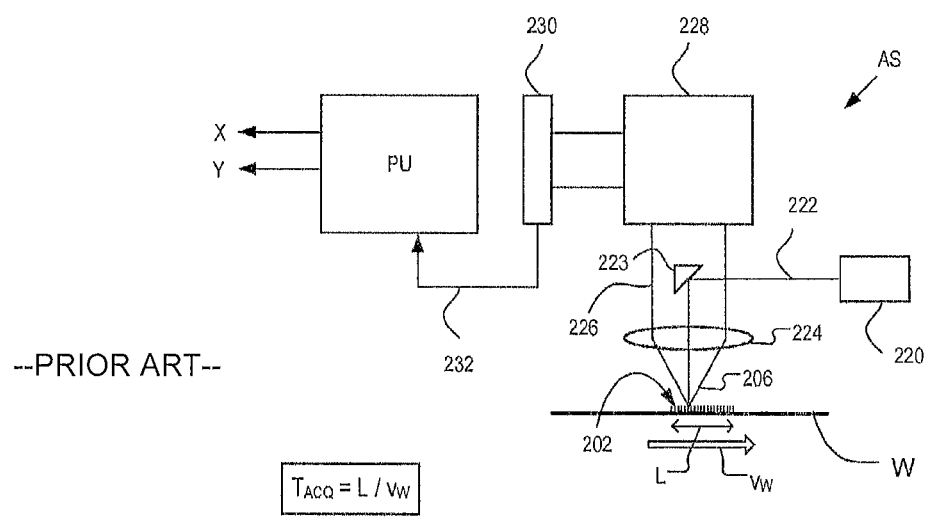
FIG. 3 is a schematic block diagram of a known alignment sensor scanning an alignment mark in the apparatus of FIG. 1.

FIG. 3 is a schematic block diagram of a known alignment sensor AS. Illumination source 220 provides a beam 222 of radiation of one or more wavelengths, which is diverted by a spot mirror 223 through an objective lens 224 onto a mark, such as mark 202, located on substrate W. As indicated schematically in FIG. 2, in the example of the present alignment sensor based on U.S. Pat. No. 6,961,116, mentioned above, the illumination spot 206 by which the mark 202 is illuminated may be slightly smaller in diameter then the width of the mark itself.

Radiation scattered by mark 202 is picked up by objective lens 224 and collimated into an information-carrying beam 226. A self-referencing interferometer 228 is of the type disclosed in U.S. Pat. No. 6,961,116, mentioned above and processes beam 226 and outputs separate beams onto a sensor array 230. Spot mirror 223 serves conveniently as a zero order stop at this point, so that the information carrying beam 226 comprises only higher order diffracted radiation from the mark 202 (this is not essential to the measurement, but improves signal to noise ratios). Intensity signals 232 from individual sensors in sensor grid 230 are provided to a processing unit PU. By a combination of the optical processing in the block 228 and the computational processing in the unit PU, values for X- and Y-position on the substrate relative to the reference frame RF are output. Processing unit PU may be separate from the control unit LACU shown in FIG. 1, or they may share the same processing hardware, as a matter of design choice and convenience. Where unit PU is separate, part of the signal processing may be performed in the unit PU and another part in unit LACU.

As mentioned already, a single measurement of the type illustrated only fixes the position of the mark within a certain range corresponding to one pitch of the mark. Coarser measurement techniques are used in conjunction with this to identify which period of the sine wave is the one containing the marked position. The same process at coarser and/or finer levels can be repeated at different wavelengths for increased accuracy, and for robust detection of the mark irrespective of the materials from which the mark is made, and on and/or below which it sits. The wavelengths can be multiplexed and demultiplexed optically so as to be processed simultaneously, and/or they may be multiplexed by time division or frequency division. Examples in the present disclosure will exploit measurement at several wavelengths to provide a practical and robust measurement apparatus (alignment sensor) with reduced sensitivity to mark asymmetry.

Referring to the measurement process in more detail, an arrow labeled $v_W$ in FIG. 3 illustrates a scanning velocity with which spot 206 traverses the length L of mark 202. In this example, the alignment sensor AS and spot 206 in reality remain stationary, while it is the substrate W that moves with velocity $v_W$. The alignment sensor can thus be mounted rigidly and accurately to the reference frame RF (FIG. 1), while effectively scanning the mark 202 in a direction opposite to the direction of movement of substrate W. The substrate is controlled in this movement by its mounting on the substrate table WT and the substrate positioning system PW.

As discussed in the prior patent application U.S. Ser. No. 13/369,614, not published at the present priority date, the high productivity requirements required of the lithographic apparatus involve the measurement of the alignment marks at numerous positions on the substrate to be performed as quickly as possible, which implies that the scanning velocity $v_W$ is fast, and the time $T_{ACQ}$ available for acquisition of each mark position is correspondingly short. In simplistic terms, the formula $T_{ACQ}=L/v_W$ applies. The prior application U.S. Ser. No. 13/369,614 describes a technique to impart an opposite scanning motion of the spot, so as to lengthen the acquisition time. The same scanning spot techniques can be applied in sensors and methods of the type newly disclosed herein, if desired.

There is interest in aligning on marks with smaller grating pitches. The measured overlay in real production is generally significantly larger than under controlled test conditions. Investigations suggest that this is due to the alignment marks on product wafers becoming asymmetric during processing. Reducing the pitch of the alignment marks typically decreases the effect of asymmetry on the measured alignment position.

The skilled person knows that some options to reduce the pitch of an alignment grating are (i) shortening the wavelength of radiation used, (ii) increasing the NA of the alignment sensor optics and (iii) using off-axis illumination. A shorter wavelength is not always possible since alignment gratings are often located underneath an absorbing film (for example an amorphous carbon hard mask). Increasing the NA is in general possible but is not preferred since there is a need for a compact objective with a safe distance from the wafer. Therefore using off-axis illumination is attractive.

Position Measurement with Off-Axis Illumination

Figure 4:
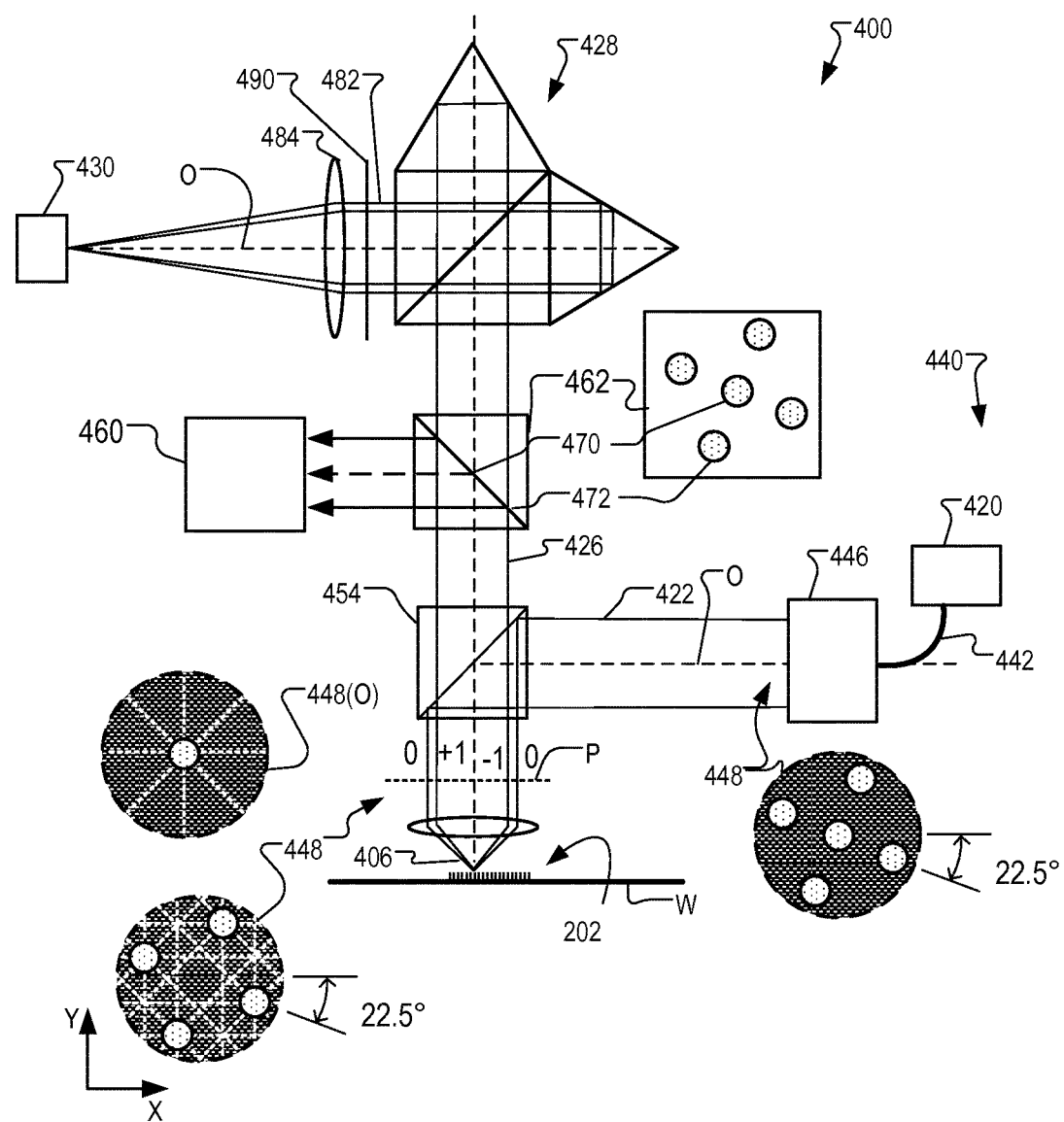
FIG. 4 is a more detailed schematic diagram of a modified alignment sensor including an asymmetry measuring arrangement forming an embodiment of the present invention and useable as the alignment sensor in the apparatus of FIG. 1.

FIG. 4 illustrates an optical system 400 of a novel alignment sensor that is a modified version of one described in the prior publications U.S. Pat. No. 6,961,116 and US 2009/195768 mentioned above. This introduces the option of off-axis illumination modes which, among other things, allow a reduced pitch of alignment mark for greater accuracy. The optical system may also allow scatterometry type measurements to be performed with the alignment sensor, rather than with a separate scatterometer instrument. An optical axis O which has several branches is indicated by a broken line running throughout the optical system 400. For ease of comparison with the schematic diagram of FIG. 3, some parts of the optical system 400 are labeled with reference signs similar to those used in FIG. 3, but with prefix "4" instead of "2". Thus, we see a light source 420, an illumination beam 422, an objective lens 424, an information carrying beam 426, a self-referencing interferometer 428 and a detectors 430. In practice a pair of detectors are provided, which receive complementary signals from the interferometer output, but that is not relevant for the present disclosure. Signals from these detectors are processed by processing unit PU (not shown in the drawings from here on), which is modified as appropriate to implement the novel features described below Additional components illustrated in this more detailed schematic diagram are as follows. In an illumination subsystem 440, radiation from source 420 is delivered via an optical fiber 442 to an illumination profiling optics 446. This delivers input beam 422 via beam splitter 454 to objective lens 424 having a pupil plane P. Objective lens 424 forms a spot 406 on alignment mark 202/204/210 on the wafer W. Information-carrying beam 426, diffracted by the mark, passes through beam splitter 454 to interferometer 428. Interferometer 428 splits the radiation field into two parts with orthogonal polarization, rotates these parts about the optical axis by 180° relative to one another, and recombines them into an outgoing beam 482. A lens 484 focuses the entire field onto a detector 430, which is an arrangement similar to the known alignment sensor of FIG. 3. The detector 430 in this example and in the known alignment sensor are effectively single photodiodes and do not provide any spatial information. A detector having spatial resolution in a conjugate pupil plane can be added, to allow angle-resolved scatterometry methods to be performed using the alignment sensor hardware.

A particular modification included in the present examples is an asymmetry measuring arrangement 460 that will be described separately, below. Arrangement 460 receives part of the information carrying beam 426 through a second beam splitter 462 positioned in advance of the interferometer.

Illumination profiling optics 446 can take various forms, some of which are disclosed in more detail in our prior U.S. patent application Ser. No. 61/623,391, not published at the present priority date. In the examples disclosed therein, alignment sensors (more generally, position measuring apparatuses) are shown which allow the use of reduced grating pitches without the need for spatial resolution on the detector side. By use of novel illumination modes, these apparatuses are able to measure the positions of marks with a wide range of different pitches, for example from less than 1 μm to pitches of 20 micron, without changing the current detector design and without changing the illumination profile. A particular feature common to the examples described in the prior application 61/623,391, is the option to use off-axis illumination at a limited range of incidence angles (limited radial extent in the pupil plane). By off-axis illumination, it is meant that source regions of radiation are confined to a peripheral portion of the pupil, that is to say, some distance away from the optical axis. Confining the illumination to an extreme periphery of the pupil reduces the smallest possible pitch of the alignment mark from substantially λ/NA to substantially λ/2NA, where λ is the wavelength of radiation used, and NA is the numerical aperture of an objective lens of the instrument (e.g. the alignment sensor or more generally the position measuring apparatus). The examples described in the prior application 61/623,391, also use a particular distribution of spot mirrors in a beam splitter of the apparatus, which can both provide the desired illumination and act as a field stop for zero order diffracted radiation. A 'universal' illumination profile can be designed that allows for aligning on any of the X, Y and XY marks without changing the illumination mode, although this inevitably brings some compromise in performance and/or some complication in the apparatus. Alternatively, dedicated modes can be designed and made to be selectable for use with the different mark types. Different polarizations of illumination can be selected also.

A primary function of the illumination profiling optics 446 is such to supply coherent radiation from at least first and second source regions within a pupil of the objective lens 424. The first and second regions are confined to a peripheral portion of said pupil (in the sense of at least being away from the optical axis). They are each limited in angular extent and are positioned diametrically opposite one another with respect to the optical axis. As will be seen from the examples in the prior application 61/623,391, the source regions may take the form of very small spots, or may be more extended in form. Further source regions may be provided, in particular third and fourth source regions may be provided rotated at 90° from the first and second regions.

The apparatus as a whole need not be limited to providing these particular illumination profiles. It may have other modes of use, both known or yet to be developed, which favor the use of different profiles.

It should be noted that in the example shown in FIG. 4 above we have omitted some polarizing elements that are typically used around the interferometer. This is only done to simplify the explanation of this idea. In a real implementation they need to be included. Additionally, it is customary to make measurements with different polarizations according to the mark type, and/or to make measurements with more than one polarization on each mark. The features to achieve desired polarizations can readily be envisaged by the skilled person.

Figure 5:
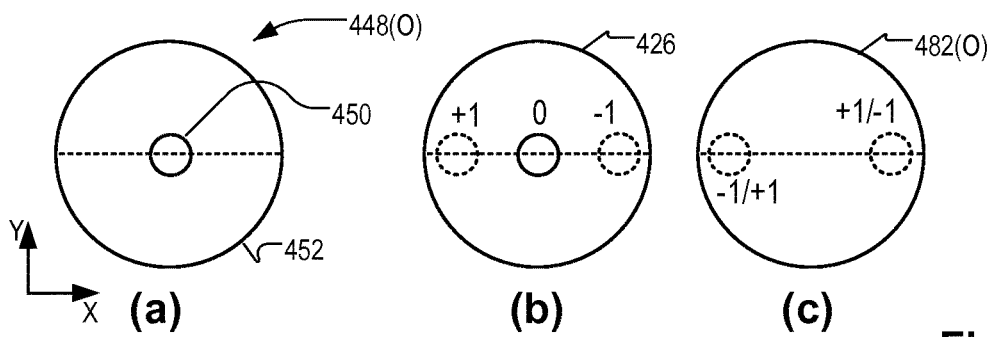
FIG. 5 illustrates (a) an on-axis illumination profile, (b) resulting diffraction signals, and (c) resulting self-referencing interferometer output for a single wavelength of radiation in one use of the position measuring apparatuses of FIG. 4.
Figure 6:
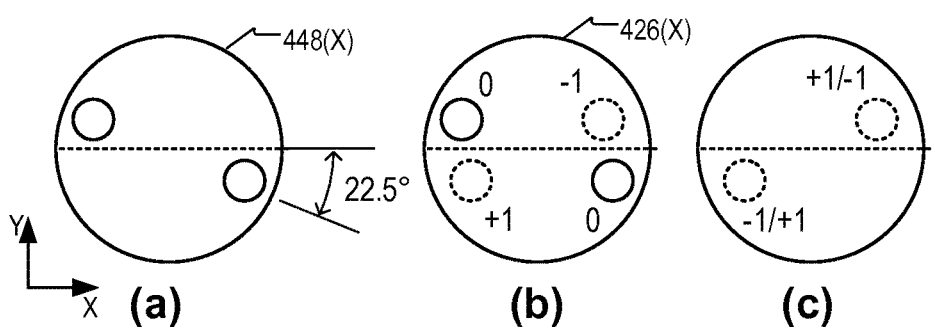
FIG. 6 illustrates (a) an off-axis illumination profile, (b) resulting diffraction signals, and (c) resulting self-referencing interferometer output in one use of the position measuring apparatuses of FIG. 4.

Referring also to FIGS. 5 and 6, we discuss selection of on- and off-axis illumination modes for the different mark types shown in FIGS. 2(a) and (b). An important example that will be accommodated in the examples below is an on-axis illumination profile, for compatibility with existing marks and measurement methods. Referring firstly to the example of an on-axis mode, as used in the known sensor of FIG. 3, illumination normal to the substrate is provided by an on-axis illumination profile 448(O) having a central bright spot within an otherwise dark pupil 452, as seen in FIG. 5 (a). This profile is an optional setting in the illumination beam 422 of the novel apparatus. In an alternative embodiment, this profile may be produced directly by illumination profiler 446 and transmitted at full intensity to objective 424 by a spot mirror within beam splitter 454. Alternatively a broad beam can be produced by profiling optics 446 (or profiling optics 446 may be omitted), and the central spot in profile 448(O) would be defined only by the spot mirror. In this example, however, it is desired for the zero order beam which returns along the optical axis to blocked before entry to interferometer 428, but also for it to be transferred to the asymmetry measuring arrangement 460. To block the zero order before the interferometer is not essential, but improves the signal to noise ratio of the position signal. Accordingly, in this embodiment, spot mirror 470 is included in the second beam splitter 462. The first splitter 454 is not silvered, and one accepts that only 50% or so of the intensity of the central spot may is transferred to the mark.

The horizontal dotted line represents the direction of periodicity of a mark being read, in this case an X direction mark. As seen in FIG. 5(b), diffraction spots of −1 and +1 order occurring in direction X will fall safely within the pupil of the optical system, so long as the grating pitch is λ/NA or less. The same is true for the cases of Y and XY marks (not illustrated). In general, an integer n may represent any diffraction order above zero. An alignment signal can be extracted when the +n order overlaps with the −n order. This is done using the self-referencing interferometer 428, giving the profile 482(O) seen at FIG. 5(c).

When we would like to use off-axis illumination, bright spots of coherent radiation can be produced at peripheral positions, also illustrated in FIG. 4. The spots in the profile 448 are in two pairs, with 180° symmetry in each pair. The pairs are at 90° to one another, and located at 22.5° to the X and Y axes. The spots have a limited radial extent and a limited angular extent in the pupil plane. By providing such a pattern of spots, all three grating directions are be supported, either in a single illumination mode, or by modes which are readily selectable in the hardware. The prior application 61/623,391 discloses various methods of producing such profiles, including by spot mirrors and by use of a self-referencing interferometer of the same form as interferometer 428. As discussed already in the context of the on-axis illumination these spots could be matched by spot mirrors in beam splitter 454 so as to form the desired illumination profile 448 at the pupil plane P of objective lens 624 without wastage of light. In this embodiment, however, the spot mirrors 472 are placed instead in the splitter 462 as shown, so that they can deliver zero order diffracted beams to the asymmetry measuring arrangement 460.

The spots and spot mirrors are likely to be much smaller in practice than the large spots illustrated schematically here. For a pupil diameter of a few centimeters, for example, the spot size may be less than 1 millimeter.

FIG. 6 shows (a) an off-axis illumination profile 448, (b) a diffraction pattern in the information carrying beam 426 and (c) an interferometer output 482 for an X-direction mark having almost half the pitch of the mark used in FIG. 5, where a suitable pair of spots of the available illumination spots are chosen to be illuminated. In this instance, despite the reduced pitch and consequently greater angle of the orders +1 and −1 fall within the pupil, sufficient for recognition of the mark position, and represents a lower limit for the grating pitch that is substantially λ/2NA, i.e. half what applied in the known instrument. The circle in each diagram again represents the pupil of the optical system, while the direction of periodicity in the mark is represented by the dotted line crossing the circle. In (a), two spots of illumination are positioned diametrically opposite one another, providing the illumination profile with 180° symmetry about the optical axis (O, not shown). (The skilled reader will understand that these spots exist in the pupil plane and are not to be confused with the spot on the mark itself, or in an image of the mark. On the other hand, 180° in the pupil plane is equivalent to 180° rotation in the image plane also.) The spots are not positioned on the X axis (dotted line), but rather offset from it by a small angle, in this example 2.5°. Consequently, the spots are offset from one another in a direction transverse to the X axis, that is to say, transverse to the direction of periodicity of the grating. At (b) we see the resulting diffraction pattern caused by the grating of the alignment mark 202. For one spot, the diffraction order +1 is within the pupil. For the other spot, the diffraction order −1 is within the pupil, at a position 180° rotated from the order +1. A zeroth order diffraction (specular reflection) of each spot coincides exactly with the position of the other spot.

If the pitch of the grating were to increase, additional orders −2 and +2 etc. may fall within the pupil. Because of the offset mentioned already, the diffraction orders of each spot remain separate from those of the other spot, irrespective of the pitch of the grating. An apparatus can be envisaged in which the offset is not present, and the illumination spots lie exactly on the X, Y and/or XY axes. However such an arrangement places many constraints on the combinations of mark pitches and radiation wavelengths that can be used, if one is to avoid unwanted overlaps between diffraction orders, and to avoid wanted diffraction orders being blocked. In embodiments where broadband or polychromatic radiation is used, the higher order diffraction signals will not be a single spot, as shown here, but rather will be spread into a first order spectrum, second order spectrum and so forth. The potential for unwanted overlaps between orders is thereby greater. The orders will be represented as spots here for simplicity only.

FIG. 6 (c) shows the result of passing the diffraction signal at (b) through interferometer 428 that mixes 180°-rotated copies of the mark image. It is assumed that the 0th order spots are blocked by a field stop at some point prior to the interferometer. A simple implementation of such a field stop would be the spot mirrors 472, where provided. The positive and negative signals for each higher order are superimposed and become mixed as indicated by +1/−1, +2/−2 etc. Provided that the original illumination spots are coherent with one another, the effect is the same as the mixing of positive and negative orders of a single illumination spot. Accordingly the interferometer, detection optics and detection electronics of the position measuring apparatus can be the same as in the known apparatus of FIG. 3. The processing of detected signals to obtain a position measurement can be substantially the same also.

The directions in which the higher order spots will be found in the diffracted radiation field are indicated for the X, Y and XY marks by white dotted lines on the profiles 448 and 448(O) in illustrated in FIG. 4. The illumination profile 448 in each mode has the properties: (i) each spot is limited in radial and angular extent and (ii) within each spot pair the spots are offset from one another in a direction transverse to any of the directions of periodicity of the X, Y or XY marks. Accordingly, higher order spots lying along these diffraction directions will not interfere with one another, at least in the middle part of the field. Adjustable field stop 490 can be provided to reduce the risk of overlap further, particularly where coarse marks are being measured. More detail of this is contained in the prior application 61/623,391, mentioned above.

The prior application further illustrates the diffraction patterns and interferometer outputs for illumination modes designed for a Y-direction mark (204 in FIG. 2(a)) and for an XY mark (210 in FIG. 2(b)). Everything that has been said above with respect to parts (a), (b) and (c) of FIGS. 5 and 6 applies equally to these parts. Because the XY mark has portions with different orientations of grating lines, each at 45° to the X and Y axes, two pairs of spots are provided in the illumination profile. As in the X and Y cases, the spots of each pair are positioned diametrically opposite one another, and slightly offset from one another in a direction transverse to the direction of periodicity of the grating. Note that the two pairs of spots do not need to be present at the same time when scanning the XY mark: each pair can be switched on for scanning the portion of the mark that has the corresponding direction of periodicity. If both pairs of spots are illuminated all the time while scanning the XY mark, then the diffraction orders received by the objective from the substrate will be only those corresponding to the direction of periodicity in the particular part of the mark being scanned.

The illumination profiles can be produced in a number of ways to form a practical instrument, bearing in mind that the opposed segments should be coherent for the interferometer 428 to produce the desired signal. Particularly when a broadband source is involved, the coherence length/time of the source radiation will be very short. Even with a monochromatic laser source, U.S. Pat. No. 6,961,116 teaches that a short coherence time is preferred, for example to eliminate interference from undesired multiple reflections. Consequently, optical path lengths from the source to each segment should be very closely matched. An aperture corresponding directly to the desired profile could be placed in a widened parallel beam, but that would result in a relatively large light loss. To circumvent the loss of light, we propose various alternative solutions in the prior application 61/623, 391, mentioned above.

The illumination emerging from the illumination source 442 may be monochromatic but is typically broadband in nature, for example white light, or polychromatic. A diversity of wavelengths in the beam increases the robustness of the measurement, as is known. The known sensor uses for example a set of four wavelengths named green, red, near infrared and far infrared. In a new sensor implementing the present invention, the same four wavelengths could be used, or a different four, or more or fewer than four wavelengths might be used.

The mark may need to be scanned more than once if it is desired for example to measure position using two different polarizations. Also it may be useful to switch the illumination mode midway through scanning the XY mark. In other embodiments, however, we use multiplexing of optical signals so that two measurements can be made simultaneously. Similarly, multiplexing can be applied so that different portions of the XY mark can be scanned and measured without switching illumination mode. A simple way to perform such multiplexing is by frequency division multiplexing. In this technique, radiation from each pair of spots and/or polarization is modulated with a characteristic frequency, selected to be much higher than the frequency of the time-varying signal that carries the position information. The diffracted and processed optical signals arriving at detector 430 will be a mixture of two signals, but they can be separated electronically using filters tuned to the respective frequencies of the source radiation. Time division multiplexing could also be used, but this would tend to involve accurate synchronization between source and detector. The modulation at each frequency can be a simple sine or square wave, for example.

If it is desired to illuminate a mark with circular polarization, whether for position sensing or some other form of metrology, a quarter wave plate (not shown) can be inserted between beam splitter 454 and objective 424. This has the effect of turning a linear polarization into a circular one (and changing it back again after diffraction by the mark). The spot positions are chosen as before according to the mark direction. The direction of circular polarization (clockwise/counterclockwise) can be changed by selecting a different linear polarization in the illumination source 420, fiber 422 or illumination profiling optics 446.

Asymmetry Measurement

As described so far, the position measurement apparatus is used for example to obtain an alignment position in a lithographic apparatus such as that shown in FIG. 1. An error will be made when the alignment mark is asymmetric. The alignment error caused by asymmetric alignment marks contributes to the overlay error in devices made using the measurements in operation of the lithographic apparatus. The intensity difference and/or phase difference between positive and negative diffracted orders gives information of the shape of the mark, in particular asymmetry. By adding an asymmetry detection arrangement 460 to the position measurement apparatus, we can measure asymmetry of the mark using much of the same hardware as the position measurement, and simultaneously with the position measurement if desired. This measurement raises the possibility to correct the alignment error caused by asymmetry, during alignment of the lithographic apparatus.

Metrology tools are available commercially to measure asymmetry. However, these are neither integrated with the alignment sensor nor are they fast enough to operate with the alignment sensor without harming throughput of a lithographic process. One known apparatus is an angle-resolved scatterometer that uses a CCD-array in a conjugate pupil plane to measure the intensity asymmetry in a diffraction spectrum. However, the known scatterometer measures asymmetry sequentially for a number of colors. In the alignment sensor, the positions signals from different colors are measured in parallel for speed. Additionally, speed, noise and power (heat) dissipation impose stringent requirements to the asymmetry measuring arrangement 460.

Figure 7:
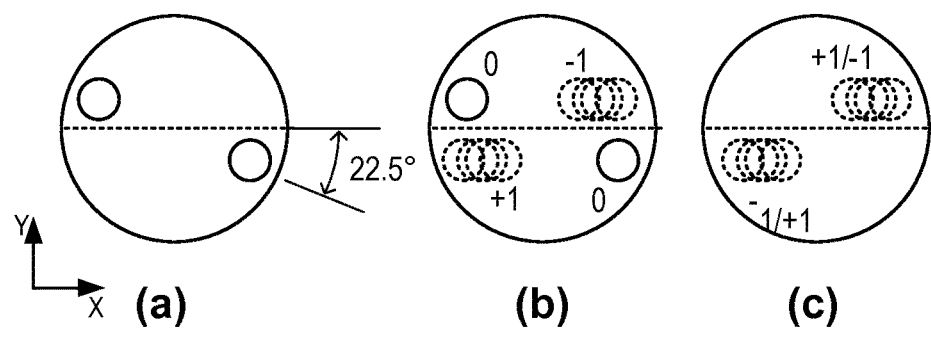
FIG. 7 illustrates (a) an on-axis illumination profile, (b) resulting diffraction signals, and (c) resulting self-referencing interferometer output for multiple wavelengths of radiation in one use of the position measuring apparatuses of FIG. 4.
Figure 8:
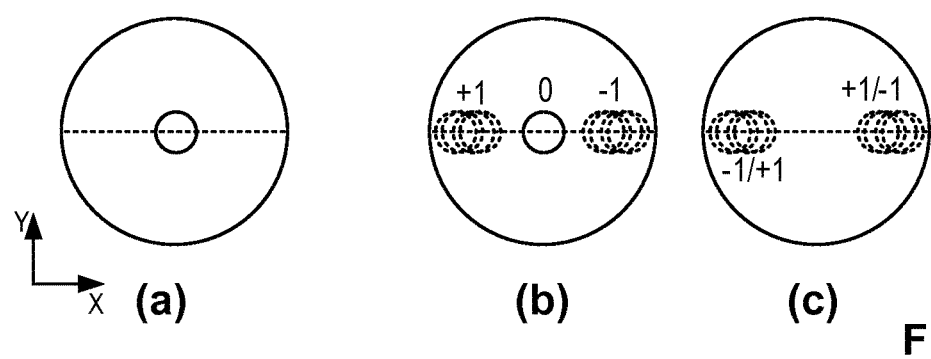
FIG. 8 illustrates (a) an off-axis illumination profile, (b) resulting diffraction signals, and (c) resulting self-referencing interferometer output for multiple wavelengths of radiation in one use of the position measuring apparatuses of FIG. 4.

Referring briefly to FIGS. 7 and 8, these show (b) diffraction patterns and (c) interferometer outputs for the same illumination profiles (a) as were shown in FIGS. 5 and 6. The difference is that in FIGS. 7 and 8 it is assumed that the illumination contains a number of different wavelengths. As mentioned already, the known alignment sensor uses a set of four wavelengths named green, red, near infrared and far infrared. These provide robust position readout from a range of marks, which may have to be read through overlying layers of different materials and thicknesses. Where the first order signals for monochromatic light appear as single spots in FIGS. 5 and 6, we see how the different wavelengths present in the illumination of the alignment sensor are spread into spectra. Where the illumination comprises several discrete wavelengths, and where the spots in practice are very much smaller than the spots illustrated here, the diffracted spots for the different colors will not necessarily overlap in the way that they are shown here. They could be separated by providing an image sensor in a conjugate pupil plane, or by measuring the different colors sequentially, like in the known scatterometer. However, image sensors are more prone to noise, each spot may cover only one pixel or less, and image sensors bring noise and heat dissipation that should be avoided if possible in the alignment sensing environment. Note that in the coarser pitch mark used in FIG. 8, the diffracted orders are significantly closer to the zero order spot at the centre. In the off-axis illumination mode with a mark of finer pitch, the first orders for the different colors are more spread out, and further from the zero orders.

While the examples described herein concentrate on $0^{th}$ order and $+/-1^{st}$ order diffraction signals, it will be understood that the disclosure extends to the capture and analysis of higher orders, for example $+/-2^{nd}$ orders, more generally $+/-n^{th}$ orders. In the examples, the $1^{st}$ orders only are shown and discussed, for simplicity.

Figure 9:
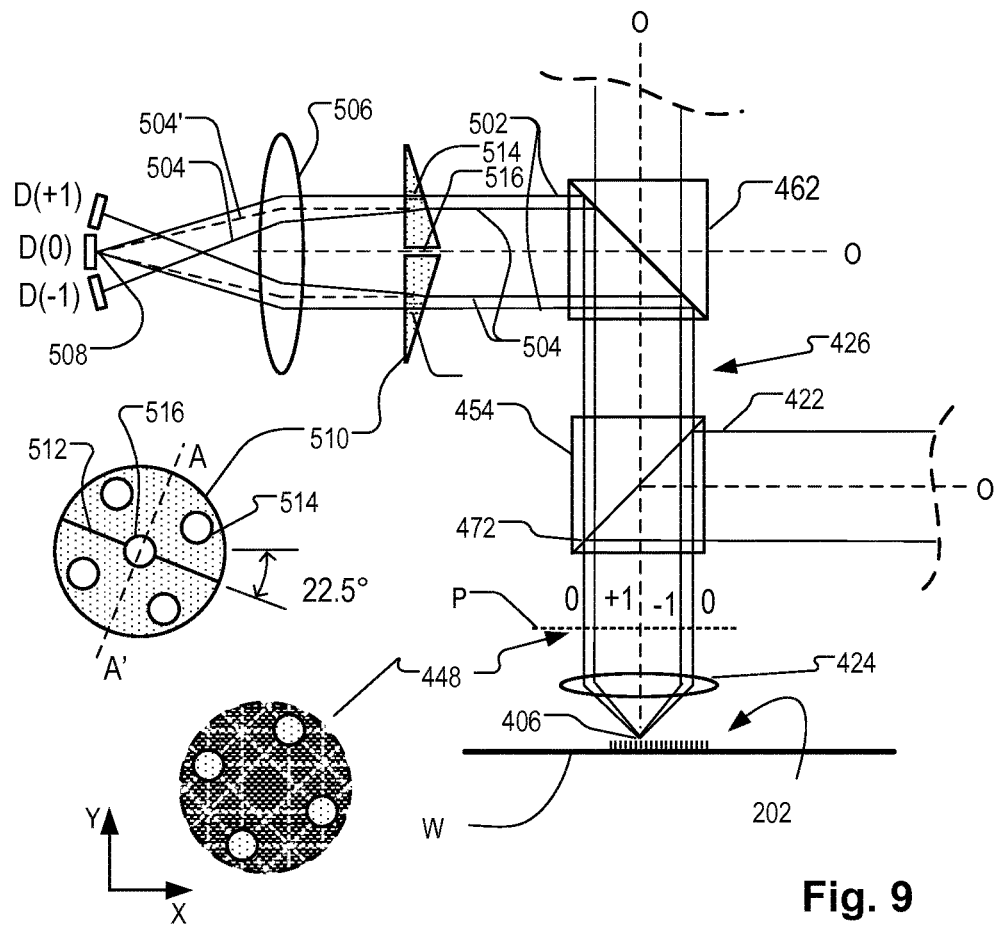
FIG. 9 is a schematic diagram of the asymmetry measuring arrangement in accordance with one embodiment of the apparatus of FIG. 4.

Referring to FIG. 9, this shows in schematic form one embodiment of asymmetry measuring arrangement 460 that can be used in the alignment sensor of FIG. 4. Parts of the alignment sensor that remain unchanged are omitted, for reasons of space. As mentioned already, asymmetry measuring arrangement 460 is a branch of the alignment sensor optical system that takes a portion of the information carrying beam 426 of the sensor using beam splitter 462. Recalling that the alignment sensor may be operating in an off-axis illumination mode, some peripheral rays 502 represent the zero order rays, while inner rays 504 represent first order diffracted rays. A lens 506 is arranged so as to form an image 508 of spot 406 on a detector labeled D(0). Prior to lens 506, however, there is inserted a pupil splitter 510. This splitter 510, also shown inset in a front view, has the form of a double wedge, with cross-section A-A' tapering either side of a split line 512. Split line 512 is arranged at 22.5° to the X or Y axis, so that none of the zeroth order and higher order diffraction rays from the off-axis spot positions will hit it. Additionally, a set of four holes 514 are provided exactly at the positions of the off-axis zero order beams. An additional hole 516 is provided on the optical axis, permitting the zero order beam to pass when using an on-axis illumination mode (FIG. 7 situation, not shown in FIG. 9). The effect of this dual wedge or dual prism arrangement is that the first order beams 504 are deflected before reaching lens 506 and they do not focus into spot 508 as the broken lines 504' would indicate. Rather, the −1 order rays 504 focus onto a detector D(−1) positioned to one side of the onto detector D(0), while the +1 order rays focus onto a detector positioned to the other side.

It can be shown that pupil splitter 510 is thus designed such that for all mark orientations, the positive and negative higher diffraction orders for all colors are separated and redirected to their separate detectors (only the first order detectors D(+1) and D(−1n) are shown). The only restriction is that for coarse pitches the center illumination spot is used (on-axis profile 448(O)) and for fine pitches the peripheral illumination spots are used. The zeroth order rays 502 are transmitted without interaction with the splitter, so that detector D(0) receives all the intensity in the zeroth order of the mark diffraction spectrum at all wavelengths. No spatial resolution is required in these detectors, which makes it easier to achieve a high signal to noise ratio in the available intensity, with compact design, low mass and low heat dissipation.

The signals measured with this asymmetry measuring branch invention allow processing unit PU to perform asymmetry detection/mark reconstruction simultaneously with alignment. This allows a correction to be applied to each measured position or a subset of them, making the alignment reading more process robust. There are no moving components added to the alignment sensor, and good use is made of the existing sensor hardware. The solution works for all mark orientations (X, Y and 45 degree marks). Numerous variations and modifications are possible within the principles of the invention as disclosed herein. Some of these will be illustrated below, without limitation. Elements from the different embodiments may be taken in isolation, or may be combined in different ways than those shown.

Figure 10:
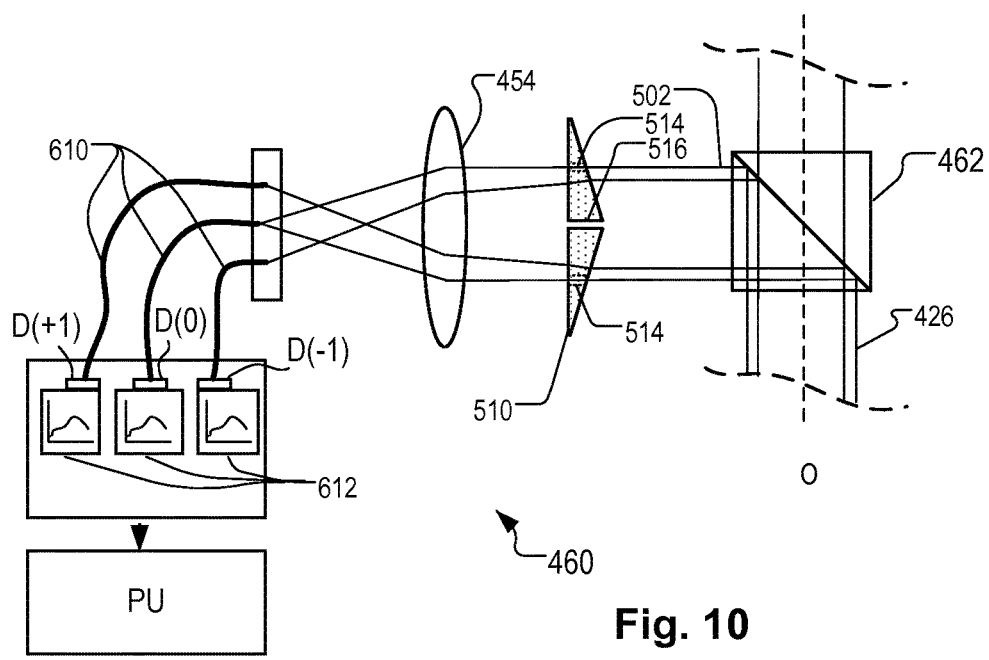
FIG. 10 illustrates in more detail a specific embodiment of the asymmetry measuring arrangement of FIG. 9.

FIG. 10 shows more detail of the detectors D(0) etc in a practical embodiment. Recalling that no spatial resolution is required in these detectors, we use optical fibers 610 to conduct the 0, −1 and +1 diffraction signals away from the optical system and to the detectors D(0) etc. This helps to isolate the alignment sensor optics from heat and electrical noise as much as possible. Also recalling that all the wavelengths of radiation are present in the diffraction orders when imaged back into spots 508 etc. by lens 506, detectors D(0) etc can be spectroscopic detectors, delivering an intensity for each order and for each wavelength from a single scan of the mark. The additional spectral information enables more detailed modeling of the asymmetry and optionally other parameters of the structure on the substrate, allowing yet more robust asymmetry measurements, with no speed penalty in the alignment. Of course, care should be taken in design to ensure that the splitting of the beams into different branches does not reduce the intensity to such an extent that the detection becomes to difficult or too noisy.

Figure 11:
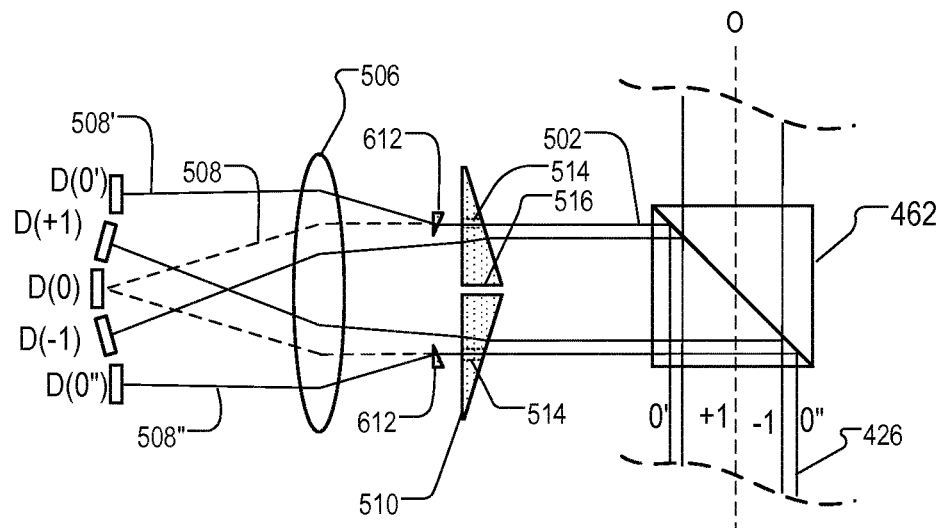
FIG. 11 is a schematic diagram of the asymmetry measuring arrangement in accordance with another embodiment of the apparatus of FIG. 4.

FIG. 11 shows a further modification in which the zero order beams which are 180° away from one another in the pupil plane are diverted by further wedges 612 to become focused on separate detectors D(0') and D(0"). With an additional wedge behind the zeroth order hole, also the two zeroth order beams can be measured separately (with separate detectors, at separate wavelengths, if desired). This can yield valuable information for modeling asymmetry and other parameters of the structure (commonly referred to as the 'stack'). Instead of a wedge, a small mirror can be positioned to deflect one or both of the zero order beams.

Figure 12:
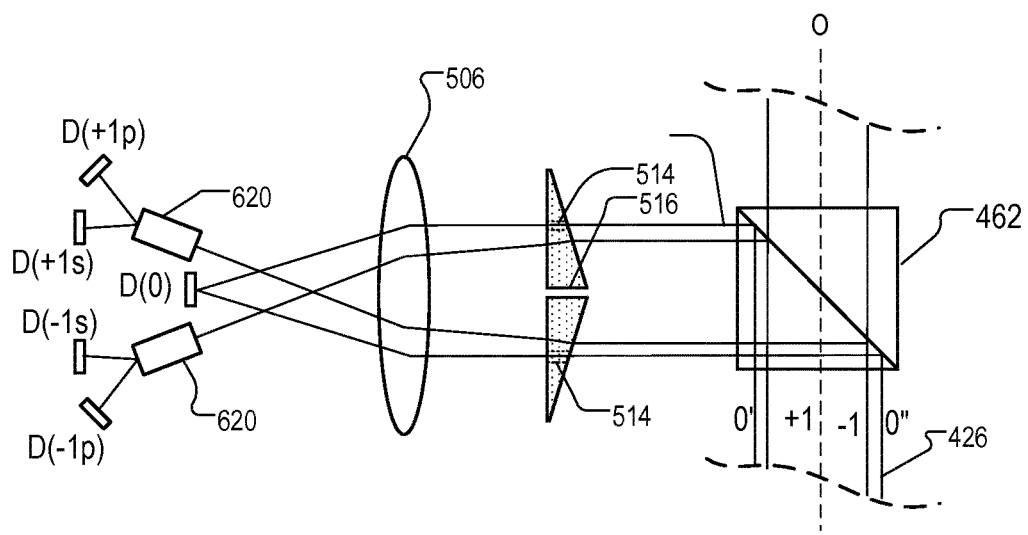
FIG. 12 is a schematic diagram of the asymmetry measuring arrangement in accordance with another embodiment of the apparatus of FIG. 4.

FIG. 12 shows a variant of the FIG. 9 arrangement in which each first order detector (or spectrometer) is itself in two branches, with polarizing elements 620 in the beam path to separate S and P polarized components. This again allows a model to be more detailed, or more constrained. Each polarizing element may be a Wollaston prism or polarizing beam splitter cubes for instance. The polarizing prisms each separate the incoming light into two orthogonal linearly polarized outgoing beams. By placing detectors for the S and P components of each diffraction order in these light paths, information of the polarization content is gathered, in addition to separating information on the positive and negative orders and the different wavelengths. An alternative arrangement, not illustrated, would first split the light into different polarizations and then split the diffraction orders. The zero order beams could also be split into different polarizations.

Figure 13:
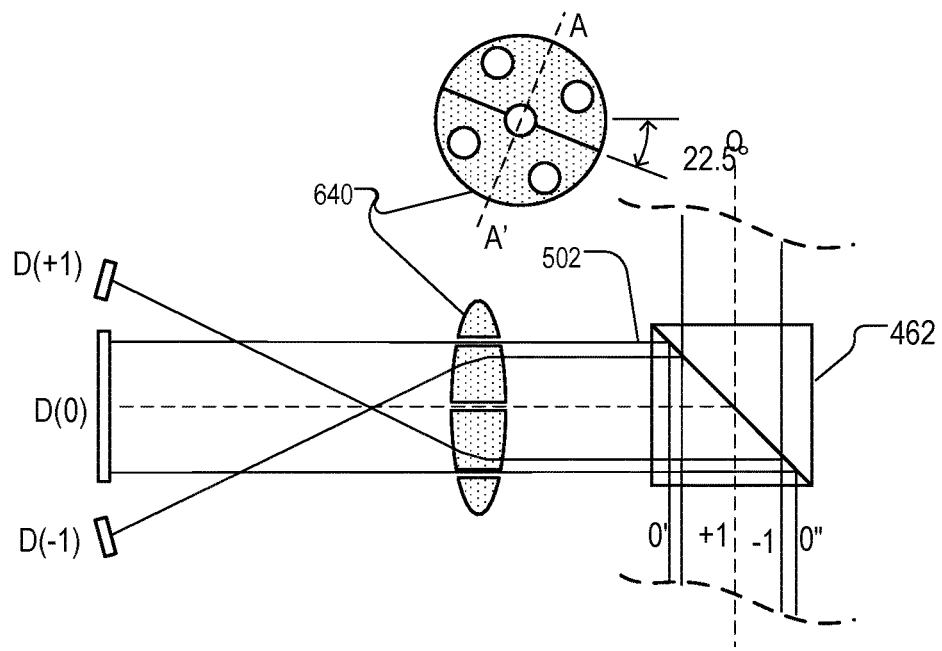
FIG. 13 is a schematic diagram of the asymmetry measuring arrangement in accordance with another embodiment of the apparatus of FIG. 4.

FIG. 13 shows a variant of the FIG. 9 arrangement in which the functions of splitter 510 and lens 506 are combined in one element. A combination pupil splitter and lens 640 is used to enable a split of the zero and higher order beams. Thus, the primary goal is to separate the zero order form the higher order beams. This result can also be obtained by means of a single optical element. The lens, which is both curved and split so as to bend the first order beams with respect to the zero order beams, has holes at the location of the zero order beams. While a large zero order detector is shown to capture the (five) different possible positions of the zero order beams, separate detectors may be used instead. Alternatively, another lens directly in front of detector D0, might be used to limit the detector entrance area. As well as being more compact, smaller detectors have a smaller parasitic capacitance which can improve signal acquisition time, and/or improve signal-to-noise ratios for a given illumination intensity. However, this does not impact the proposed implementation of the beam discrimination principle. As in the other embodiments, splitting the polarizations and splitting the different zero orders to different detectors may also be done to yield additional information for analysis.

Figure 14:
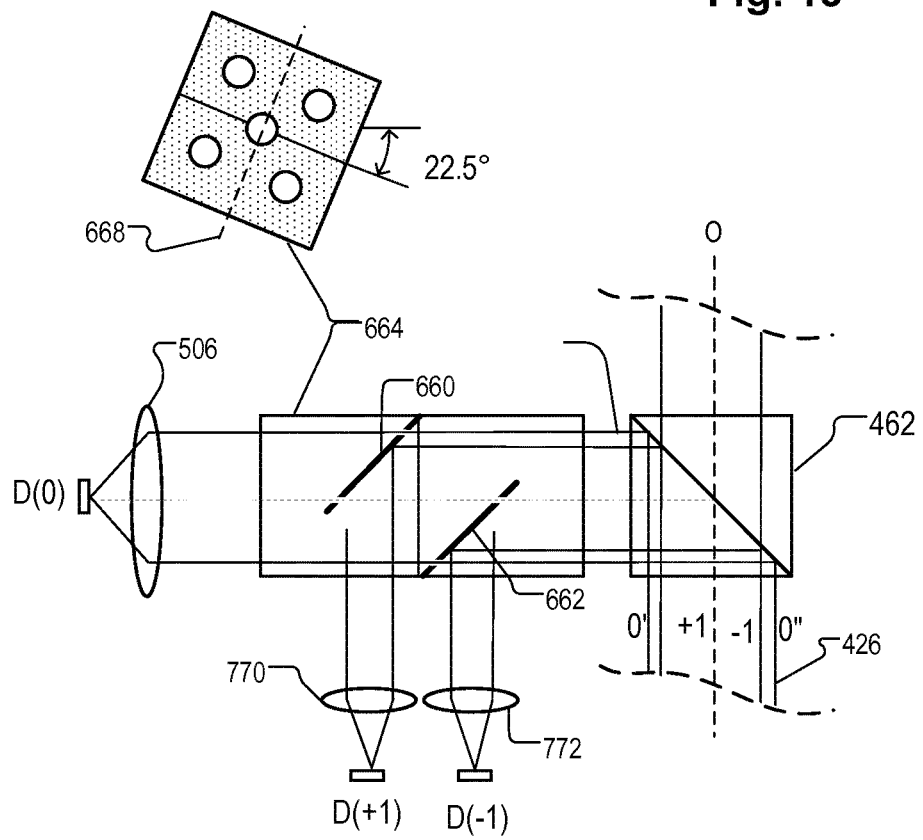
FIG. 14 is a schematic diagram of the asymmetry measuring arrangement in accordance with another embodiment of the apparatus of FIG. 4.

FIG. 14 shows a variant in which not a wedge prism but split mirrors 660, 662 are used to split the pupil plane. In embodiment, the mirror is made of two partial beam splitters that have reflecting surfaces that have normal angles >0° with respect to the incoming beam. In the illustration the surfaces are at 45° to normal, and each covers half of the field bounded by a line at 22.5° to the X or Y axis. Light that hits either mirror surface will be reflected toward a detector. An end view of the splitter 664 is shown inset. To simplify the construction, the higher order detectors D(−1) and D(+1) are offset on axis 668. Each mirror has holes at locations of the zero order beams. Hence, the zero order beams are not deflected and instead collected by lens 506. Hereby, the zero order beams are separated from the first order beams. Again, spectroscopic analysis can be performed. As the higher order radiation no longer passes through lens 506, separate lenses 670, 672 are provided to focus higher order radiation onto the detectors D(−1), D(+1) etc. While the mirrors are shown spaced longitudinally and diverted the radiation to the same side of the optical axis, in other embodiments the mirrors may divert the opposite orders to opposite sides of the optical axis.

While the FIG. 4 apparatus is used as an example, the same principles for asymmetry measurement can be adapted to various designs of asymmetry sensor such as are described in the prior patent application 61/623,391, mentioned above. Depending on the illumination profiles and grating pitches and directions, it may be difficult to cover all modes of operation with a single, non-moving pupil splitter. Various options can be considered for making the splitter adapt to different profiles, including moving parts, exchangeable parts, electro-active parts. The principles of asymmetry measurement disclosed herein can also be applied independently of alignment sensing, if desired, to form a stand-alone sensor or part of another tool.

Instead of providing separate detectors D(−1), D(0) etc, an image sensor or other multi-segment detector could be applied to achieve the same effect within the scope of the invention. Where the sensor is planar, the optics around lens 506 may become complicated to achieve focus of all the orders, or some defocusing may be permitted. In any of the embodiments, the detectors may include optical fibers or other light guides arranged to deliver radiation from a detector input location to a more convenient location where a detector element is physically located. Combining for example the FIG. 9 and FIG. 10 embodiments, one can envisage that the inputs of optical fibers can be position to define nominal detector positions, not arranged in a plane, while the detector elements physically are arranged in a plane. The detector for each order may be provided with multiple segments or areas of pixels, so as to permit other measurement purposes, for example focusing. Signals from these segments can combine so that the segments serve as a single detector for the purposes of the present disclosure. Any of the detectors can be divided and combined with filters to detect different wavelengths of radiation separately. Different wavelengths can be multiplexed optically or by time division, frequency division or the like, without departing from the principles of the present invention.

While we refer in the description and claims to a spot of radiation as being formed on the structure that forms the alignment mark, the term "spot" is not to be understood as requiring any particular size or shape of illuminated area. The illumination spot may be round or elongated, for example. Similarly, while we refer to images of said spot being formed to fall on a variety of detectors, the images of the spot may or may not have the same shape as the spot itself. The only requirement is for radiation from known directions to be collected and focused onto a well-defined area on the structure, and for that area to be imaged sufficiently for diffracted radiation from the illuminated area to be collected and re-focused to fall within a sensitive area of a desired detector. Multiple spots with respective detectors are not excluded.

It should be understood that the processing unit PU which controls alignment sensor, processes signals detected by it, and calculates from these signals position measurements suitable for use in controlling the lithographic patterning process, will typically involve a computer assembly of some kind, which will not be described in detail. The computer assembly may be a dedicated computer external to the apparatus, it may be a processing unit or units dedicated to the alignment sensor or, alternatively, it may be a central control unit LACU controlling the lithographic apparatus as a whole. The computer assembly may be arranged for loading a computer program product comprising computer executable code. This may enable the computer assembly, when the computer program product is downloaded, to control aforementioned uses of a lithographic apparatus with the alignment sensor AS.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. An apparatus for method of measuring an asymmetry dependent parameter of a periodic structure on a substrate, the apparatus comprising:
    an illumination optical system for focusing radiation into a spot on said structure;
    first and second detectors of radiation;
    a detection optical system for receiving radiation diffracted by the periodic structure, including at the same time both positive and negative higher orders of diffracted radiation, and forming first and second images of said spot on first and second detectors respectively, wherein said negative order radiation is used to form the first image and said positive order radiation is used to form the second image;
    a processor for processing together signals from said first and second detectors representing intensities of said positive and negative orders to produce a measurement of said asymmetry dependent parameter in the periodic structure; and a position sensing optical system, the position sensing optical system and detection optical system each receiving a share of said positive and negative orders of diffracted radiation, the position sensing optical system comprising an interferometer for generating a position-sensitive signal that varies as the spot of radiation traverses the periodic structure, the processor further processing the position-sensitive signal to calculate a position of the substrate relative to the apparatus.

2. An apparatus as claimed in claim 1 wherein said illumination optical system is operable in an on-axis illumination mode in which said spot is formed by a beam radiation aligned with an optical axis of said detection optical system.

3. An apparatus as claimed in claim 1 wherein said illumination system is operable in an off-axis mode of illumination in which said spot is formed by at least two beams of radiation incident from directions symmetrically opposite one another with respect to an optical axis of said detection optical system.

4. An apparatus as claimed in claim 1 wherein said illumination optical system is selectively operable in an on-axis illumination mode in which said spot is formed by a beam radiation aligned with an optical axis of said detection optical system and an off-axis mode of illumination in which said spot is formed by at least two beams of radiation incident from directions symmetrically opposite one another with respect to an optical axis of said detection optical system.

5. An apparatus as claimed in claim 1 wherein said first and second detectors can resolve different wavelengths of radiation and said processor compares signals captured at more than one wavelength for each of said positive and negative orders to provide said measure of an asymmetry dependent parameter.

6. An apparatus as claimed in claim 1 wherein said detection optical system comprises a splitting element located in a pupil plane for diverting opposite portions of a radiation field in different directions, whereby diffraction orders passing through one half of the pupil plane are deflected differently to diffraction orders passing through the other half.

7. An apparatus as claimed in claim 6 wherein said splitting element has portions formed to allow one or more zero order beams to pass undiverted.

8. An apparatus as claimed in claim 6 wherein said splitting element comprises a one or more prismatic refracting elements provided upstream from a focusing element which forms the separate images of the spot on the first and second detectors.

9. An apparatus as claimed in claim 6 wherein said splitting element is combined with a focusing element which forms the separate images of the spot on the first and second detectors.

10. An apparatus as claimed in claim 6 wherein said splitting element comprises one or more reflectors.

11. An apparatus as claimed in claim 1 wherein said detection optical system is operable also to form an image of said spot using zeroth order diffracted radiation received from the structure on a third detector.

12. An apparatus as claimed in claim 1 wherein said illumination system is operable in an off-axis mode of illumination in which said spot is formed by at least two beams of radiation incident from directions symmetrically opposite one another with respect to an optical axis of said detection optical system, wherein said detection optical system is operable also to form separate images of said spot using zeroth order diffracted radiation of said two beams on third and fourth detectors.

13. An apparatus as claimed in claim 1 wherein said detection optical system and detectors are arranged to process different polarization components of said diffracted radiation separately, and said processor is arranged to process signals representing intensities of said positive and negative diffraction orders in said different polarizations together.

14. An apparatus as claimed in claim 1 wherein said processor is arranged to use said measurement of an asymmetry dependent parameter when calculating said position, to correct at least partially for asymmetry sensitivity in the position-sensitive signal.

15. A lithographic apparatus comprising:
a patterning subsystem for transferring a pattern to a substrate;
a measuring subsystem for measuring positions of said substrate in relation to the patterning subsystem,
wherein the patterning subsystem is arranged to use the positions measured by the measuring subsystem to apply said pattern at a desired position on the substrate and wherein the measuring subsystem includes an apparatus as claimed in claim 1.

16. A method of measuring an asymmetry dependent parameter of a periodic structure formed on a substrate, the method comprising the steps of:
(a) focusing radiation into a spot on said structure;
(b) receiving radiation diffracted by the periodic structure, including at the same time both positive and negative higher orders of diffracted radiation,
(c) forming first and second images of said spot on first and second detectors respectively, wherein said negative order radiation is used to form the first image and said positive order radiation is used to form the second image;
(d) processing together signals from said first and second detectors representing intensities of said positive and negative orders to produce a measurement of an asymmetry dependent parameter in the periodic structure; and
(f) using a share of said positive and negative orders of diffracted radiation for generating a position-sensitive signal that varies as the spot of radiation traverses the periodic structure, and
(g) processing the position-sensitive signal to calculate a position of the substrate relative to the apparatus.

17. A method as claimed in claim 16 wherein said spot is formed by a beam radiation aligned with an optical axis of an optical system used to form said images of said spot.

18. A method as claimed in claim 16 wherein said spot is formed by at least two beams of radiation incident from directions symmetrically opposite one another with respect to an optical axis of an optical system used to form said images of said spot.

19. A method as claimed in claim 16 wherein, depending on a pitch of the periodic structure being measured, said spot is either formed by a beam radiation aligned with an optical axis of an optical system used to form said spot or said spot is formed by at least two beams of radiation incident from directions symmetrically opposite one another with respect to the optical axis of said optical system.

20. A method as claimed in claim 16 wherein said first and second detectors can resolve different wavelengths of radiation and step (d) compares signals captured at more than one wavelength for each of said positive and negative orders to provide said measure of said asymmetry dependent parameter.

21. A method as claimed in claim 16 further comprising (e) forming on a third detector an image of said spot using zeroth order diffracted radiation received from the structure.

22. A method as claimed in claim 21 wherein said spot is formed by at least two beams of radiation incident from directions symmetrically opposite one another with respect to an optical axis of said detection optical system, and step (e) comprises forming on third and fourth detectors separate images of said spot using zeroth order diffracted radiation of said two beams.

23. A method as claimed in claim 16 wherein different polarization components of said diffracted radiation are processed separately, and in step (d) signals representing intensities of said positive and negative diffraction orders in said different polarizations are processed together to obtain said measure of said asymmetry dependent parameter.

24. A method as claimed in claim 16 wherein in step (g) said measurement of an asymmetry dependent parameter is used to correct at least partially for asymmetry sensitivity in the position-sensitive signal.

25. A method of manufacturing devices wherein a device pattern is applied to a substrate using a lithographic process, the method including positioning the applied pattern by reference to measured positions of one or more periodic structures formed on the substrate, the measured positions being obtained by a method as claimed in claim 16.

* * * * *